United States Patent [19]

Bender et al.

[11] Patent Number: 4,468,280
[45] Date of Patent: Aug. 28, 1984

[54] SILICON RIBBON GROWTH WHEEL AND METHOD FOR SURFACE TEMPERATURE PROFILING THEREOF

[75] Inventors: David L. Bender; Samuel N. Rea, both of Thousand Oaks, Calif.

[73] Assignee: Atlantic Richfield Company, Los Angeles, Calif.

[21] Appl. No.: 453,690

[22] Filed: Dec. 27, 1982

[51] Int. Cl.³ ............. C30B 19/02; C30B 29/06; C30B 35/00

[52] U.S. Cl. ............... 156/624; 156/DIG. 64; 156/DIG. 88; 422/246; 422/254; 164/122.2; 164/423; 164/427; 164/443; 425/223; 425/224; 264/212

[58] Field of Search ....... 156/624, DIG. 64, DIG. 88; 164/122, 122.2, 423, 427, 443, 463, 479, 485; 422/246, 254; 264/212; 425/223, 224

[56] References Cited

U.S. PATENT DOCUMENTS

| 3,534,438 | 10/1970 | Bushnell et al. | 425/224 |
| 3,605,863 | 9/1971 | King | 164/156 |
| 3,939,900 | 2/1976 | Polk et al. | 164/423 |
| 4,184,532 | 1/1980 | Bedell et al. | 164/423 |
| 4,307,771 | 12/1981 | Draizen et al. | 164/423 |

FOREIGN PATENT DOCUMENTS

| 55-126528 | 9/1980 | Japan | 264/212 |
| 55-113610 | 9/1980 | Japan | 264/212 |
| 546430 | 3/1977 | U.S.S.R. | 164/443 |
| 251781 | 12/1977 | U.S.S.R. | 164/443 |

Primary Examiner—David Lacey
Attorney, Agent, or Firm—Albert C. Metrailer

[57] ABSTRACT

A silicon ribbon growth wheel having an internal cooling fluid contacting surface modified to provide a lateral temperature profile on the wheel surface of lower temperature near the wheel edges. In a preferred form the inner surface is provided with grooves near the wheel edges to increase heat conduction to the cooling fluid at the wheel edges. A method for surface temperature profiling the growth wheel is also disclosed. A method for surface temperature profiling the growth wheel is also disclosed.

7 Claims, 2 Drawing Figures

SILICON RIBBON GROWTH WHEEL AND METHOD FOR SURFACE TEMPERATURE PROFILING THEREOF

BACKGROUND OF THE INVENTION

The present invention relates to method and apparatus for the production of semiconductor ribbon from a melt and more particularly to improved apparatus and method in which ribbon stress and brittleness are avoided by controlling the temperature profile of a moving chill surface.

A reference known to the Applicants and believed to be relevant to the present invention is U.S. Pat. No. 3,605,863 issued to King on Sept. 20, 1971. This patent is hereby incorporated by reference for its general teachings of apparatus and methods for formation of ribbon materials which are generally applicable to formation of semiconductor ribbons.

It is generally recognized that a major portion of the cost of production of solar cells is the cost of the original high-purity silicon and its preparation into wafers of suitable size and shape. A standard process involves the growing of monocrystalline boules using the Czochralski technique and then mechanically sawing the boules into thin slices or wafers. Half of the original silicon material is typically lost in a sawing process. Photovoltaic cells have also been made from polycrystalline silicon after it was poured into essentially brick-shaped molds and then sawed into square slices. While such processing of polycrystalline material is less expensive than growth of single-crystal material, the resulting cells have lower efficiency and essentially half of the material is still lost in the sawing process. Much effort has therefore been made to develop apparatus and techniques for producing wafers or ribbons of silicon directly from the molten state. The above-referenced King patent illustrates one type of apparatus which has resulted from such efforts.

The basic method illustrated by the King patent includes the contacting of a molten body of material with the surface of a moving drum or wheel. The surface of the wheel is cool relative to the molten mass and by cooling a portion thereof pulls or drags off a film or ribbon of the material in a solidified or partially-solidified form. When such a process is used to manufacture ribbons of metallic materials good quality ribbons can be obtained over a fairly wide range of operating conditions. However, the application of the method to production of semiconductor materials has proven difficult for a number of reasons including the fact that semiconductor materials undergo a considerable dimensional change upon solidification. The dimensional change results in considerable internal stress which typically causes waviness in the produced material or can cause it to spontaneously split or even shatter into small pieces. While various annealing techniques have been employed to remove the built-in stress after ribbon formation it would be very desirable to eliminate the stress from the material as produced.

SUMMARY OF THE INVENTION

Accordingly, an object of the present invention is to provide improved apparatus for producing semiconductor ribbon materials.

Another object of the present invention is to provide equipment for manufacturing semiconductor ribbon material having reduced levels of internal stress.

Apparatus according to the present invention includes means for contacting a molten mass of semiconductor material with a surface of a rotating wheel where the wheel surface temperature is controlled to be cooler along its edges than near its center. In a preferred form the temperature profile is controlled by providing grooves on an inner surface of the rotating wheel which contacts a cooling fluid thereby improving the thermal conductivity of the heat-flow path from said fluid to the edges of the outer wheel surface.

BRIEF DESCRIPTION OF THE DRAWINGS

The present invention may be better understood by reading the following detailed description of the preferred embodiments with reference to the accompanying drawings wherein.

DESCRIPTION OF THE PREFERRED EMBODIMENT

Figure 1:
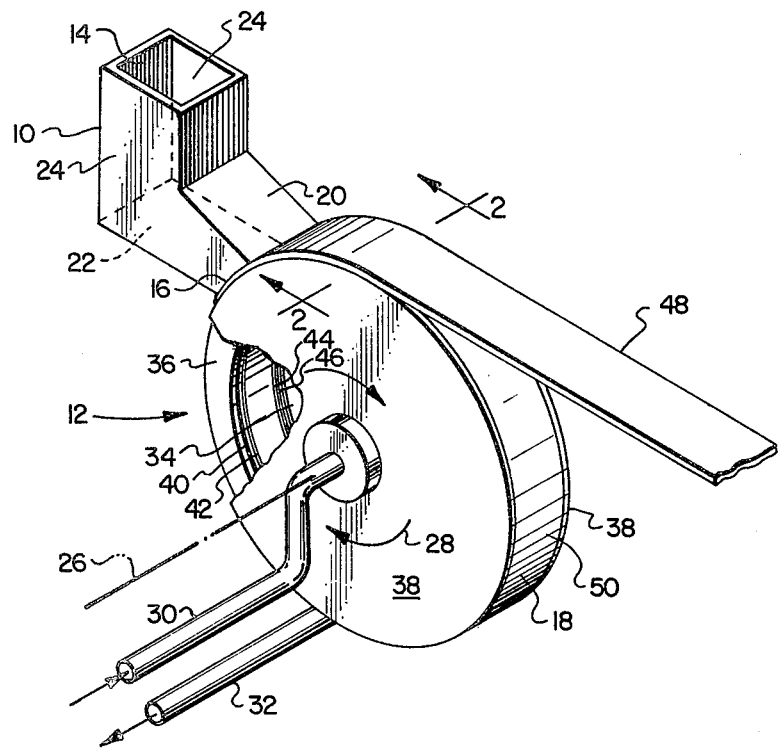
FIG. 1 is a perspective view of the basic components of a ribbon-production apparatus according to the present invention; and, FIG. 2 is a cross-sectional illustration of the wheel or drum of FIG. 1 illustrating the thermal-profile-generating grooves on the inner surface of the wheel.

With reference now to FIG. 1 there is illustrated the basic components of a ribbon-producing apparatus according to the present invention. The basic elements comprise a tundish 10 and a rotating wheel 12. Tundish 10 comprises a number of flat quartz plates assembled to form an enclosure having an inlet 14 for receiving molten semiconductor material and an outlet 16 adjacent an outer surface 18 of wheel 12. Opening 16 has the shape of a narrow rectangular slot formed between upper and lower plates 20 and 22 and a pair of side plates 24. The inner edges of side plates 24 are spaced apart by a distance corresponding to the width of surface 18 of wheel 12, which in the preferred embodiment is nominally two inches. Wheel 12 is provided with means for rotating about axis 26 in the direction indicated by arrow 28 in a manner such as that illustrated in the above-referenced King patent. Also as illustrated in the King patent there are provided cooling fluid inlet and outlet conduits 30 and 32 respectively, connected through appropriate rotating seals to an interior cavity 34 of the wheel 12. The cavity 34 is formed by a rim portion 36 of wheel 12 and two circular side plates 38. In the preferred embodiment, rim 36 was formed from stainless steel and had an outer diameter of twelve inches and, as indicated above, a width of two inches. As will be explained in more detail below, heat absorbed by outer surface 18 of wheel 12 is conducted through the rim 36 to the cooling fluid within cavity 34. In this preferred embodiment a number of grooves such as grooves 40 and 42 are cut along the inner surface of rim 36 to improve the thermal conductivity through rim 36 along its edges.

Figure 2:
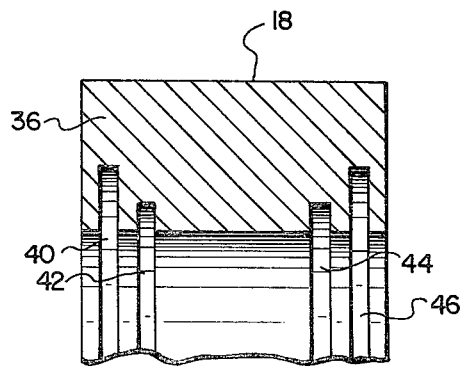

More details of the groove structure of rim 36 are illustrated in the cross-sectional view of FIG. 2. As shown in FIG. 2, two grooves 40 and 42 are provided near the left edge of rim 36 and two similar grooves 44 and 46 are provided near the right edge of rim 36. In the preferred embodiment, each of the grooves 40, 42, 44 and 46 is one-eighth inch wide. Grooves 40 and 46 are spaced about one-eighth inch from the outer edges of rim 36. Grooves 42 and 44 are each spaced about one-eighth inch inboard from grooves 40 and 46. Grooves 40 and 46 are about seven-sixteenths inch deep while grooves 42 and 44 are about three-sixteenths inch deep.

In operation the wheel 12 is rotated at between ten and fifteen revolutions per minute while molten semiconductor material is poured into opening 14 of tundish 10. The molten silicon, typically at a temperature above 1500° C., contacts the rotating wheel surface 18 at the opening of tundish 16 and is at least partially solidified at that point of form a ribbon 48. The ribbon 48 is lifted from the wheel surface 18 by a scraper and carried away by a conveyer system which are not illustrated to simplify the drawings. Most of the heat which is absorbed from the molten silicon passes through rim 36 to the cooling fluid in cavity 34. The fluid is preferably room temperature cooling water circulating through the cavity at about two gallons per minute. The cooling fluid circulates through the grooves 40, 42, 44 and 46 thereby providing more cooling effect near the edges of wheel surface 18 than near the center. The grooves 40, 42, 44 and 46 increase the cooling effect both by reducing the length of the thermal path from surface 18 to the cooling fluid and by increasing the contact area of the inner surface with the cooling fluid.

In a typical run under the conditions specified above the center line wheel temperature at about point 50 stabilized at about 270° C. and the edges stabilized at about 210° C. Silicon ribbon produced under these conditions exhibited greatly reduced stress as evidenced by no shattering or splitting of the produced ribbon. We believe that the ideal temperature profile would be parabolic and that edge to center differentials of 50° to 100° C. are sufficient to reduce stresses to acceptable levels.

In the above-described embodiment the lateral temperature profile was produced by increasing the thermal conductivity from the edges of surface 18 to the cooling fluid. The temperature profile can also be achieved or enhanced by reducing the thermal conductivity of the center portion of rim 36. Thus, for example, a thin layer of low conductivity (relative to the rim 36) material may be applied to the center portion of the cooling fluid contacting surface of rim 36.

While the present invention has been illustrated and described with respect to particular apparatus and methods of operation, it is understood that various modifications and changes can be made therein within the scope of the present invention as defined by the appended claims.

What is claimed is:

1. In apparatus for the production of semiconductor ribbon in which molten semiconductor material is brought into contact with the surface of a rotating metallic wheel which wheel is cooled by a cooling fluid in an interior cavity of said wheel, the improvement comprising:

said wheel having a thermal conductivity modifying means on its inner cooling fluid contacting surface for enhancing heat flow from the edges of the semiconductor contacting surface relative to the center thereof.

2. Improved apparatus according to claim 1 wherein said thermal conductivity modifying means comprises one or more grooves cut into the inner fluid contacting surface along each edge of said surface.

3. Improved apparatus according to claim 1 wherein said thermal conductivity modifying means comprises two grooves in said inner surface along each edge and the grooves nearest the wheel edges are deeper than the inner grooves.

4. Improved apparatus according to claim 3 wherein said wheel is two inches wide, said grooves are each one-eighth inch wide, the outer grooves are each seven-sixteenths inch deep and spaced one-eighth inch from the wheel edges, and the inner grooves are three-sixteenths inch deep and spaced one-eighth inch from the outer grooves.

5. A method for reducing internal stress and brittleness in semiconductor ribbon formed by contacting molten semiconductor material with the surface of a cool rotating wheel comprising:

controlling the temperature profile across the semiconductor contacting surface of said wheel so that the edges of said surface are at least 50° C. cooler than the center of said surface as it contacts the molten semiconductor material.

6. The method of claim 5 wherein said wheel is cooled by a cooling fluid in an interior cavity of said wheel and said temperature profile is controlled by increasing the thermal conductivity of the wheel in selected regions between said cooling fluid and the outer edges of the semiconductor contacting surface of said wheel.

7. The method of claim 6 wherein the increased thermal conductivity of said selected regions is provided by longitudinal grooves in the inner fluid contacting surface of said wheel in said selected regions.

* * * * *